(12) United States Patent
Chang et al.

(10) Patent No.: US 6,583,443 B1
(45) Date of Patent: Jun. 24, 2003

(54) LIGHT EMITTING DIODE AND METHOD OF MAKING THE SAME

(75) Inventors: Chih-Sung Chang, Taipei (TW); Kuang-Neng Yang, Ping Chen (TW); Tzer-Perng Chen, Hsinchu (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/196,370

(22) Filed: Jul. 17, 2002

(30) Foreign Application Priority Data

Dec. 26, 2001 (TW) ........................... 90132394 A

(51) Int. Cl.⁷ ............................................. H01L 29/26
(52) U.S. Cl. .................... 257/79; 257/13; 257/656; 257/749; 438/22; 438/24
(58) Field of Search ................. 257/13, 79–103, 257/656, 749, 918; 438/22, 24, 37, 608, 609

(56) References Cited

U.S. PATENT DOCUMENTS

| | | | | |
|---|---|---|---|---|
| 5,300,791 A | * | 4/1994 | Chen et al. | 257/94 |
| 5,359,209 A | * | 10/1994 | Huang | 257/94 |
| 5,751,752 A | * | 5/1998 | Shakuda | 372/45 |

* cited by examiner

Primary Examiner—David Nelms
Assistant Examiner—Long K. Tran
(74) Attorney, Agent, or Firm—Troxell Law Office PLLC

(57) ABSTRACT

A light emitting epi-layer structure which contains a temporality light absorption substrate on one side, the other side thereof can be adhered to a light absorption free transparent substrate in terms of a transparent adhesive layer which is light absorption free too. After that, the light absorption substrate portion is removed by means of an etching process. The resulted light emitting diode has significant improvement in light emitting efficiency. Moreover, the transparent conductive layer is a low resistance and high transparency layer. The current flow can thus be distributed evenly than conventional one.

22 Claims, 7 Drawing Sheets

LIGHT EMITTING DIODE AND METHOD OF MAKING THE SAME

This application incorporates by reference Taiwanese application Ser. No. 90132394, filed on Dec. 26, 2001

BACKGROUND OF THE INVENTION

1. Field of the Invention

The present invention relates to a light emitting device, and more particularly to an AlGaInP light emitting diode structure.

2. Description of the Prior Art

The conventional AlGaInP LED has a double heterostructure (DH), as shown in FIG. 8. The LED stacked sequentially, from a bottom thereof, has an n-type ohmic contact electrode 2, a GaAs substrate 3, an n-type $(Al_xGa_{1-x})_{0.5}In_{0.5}P$ lower cladding layer 4 with an Al composition between about 70%–100%, an $(Al_xGa_{1-x})_{0.5}In_{0.5}P$ active layer 5 with an Al composition of 0%–45%, a p-type $(Al_xGa_{1-x})_{0.5}In_{0.5}P$ upper cladding layer 6 with an Al composition 70%–100%, a p-type high energy band gap current spreading layer 7 such as layers of GaP, GaAsP, AlGaAs or GaInP, and a p-type ohmic contact layer 8 as well as a bonding pad 9.

With the composition alternation of the active layer 5, the wavelengths of the light emitted are varied from 650 nm: red to 555 nm: green. A drawback is generally found in the conventional LED, that is: while the light emitted from the active layer 5 towards the substrate 3 will be totally absorbed by GaAs substrate 3. It is because the GaAs substrate has an energy gap smaller than that of the active layer 5. Therefore, the light generated is absorbed resulted in lower light generated efficiency for this kind of conventional AlGaInP LED.

To overcome the substrate 3 light absorption problem, several conventional LED fabrication technologies have been disclosed. However, those conventional technologies still accompany with several disadvantages and limitations. For example, Sugawara et al. disclosed a method published in Appl. Phys. Lett. Vol. 61, 1775(1992), Sugawara et al. inserted a distributed Bragg reflector (DBR) layer in between GaAs substrate and lower cladding layer so as to reflect those light emitted toward the GaAs substrate. However, the reflectivity of DBR layer is usefully only for those light which almost vertically towards the GaAs substrate. With the decrease of injection angle, the reflectivity is drastically decreased. Consequently, the improvement of external quantum efficiency is limited.

Kish et al. disclosed a wafer-bonded transparent-substrate (TS) $(Al_xGa_{1-x})_{0.5}In_{0.5}P/GaP$ light emitting diode, entitled "Very high efficiency semiconductor wafer-bonded transparent-substrate $(Al_xGa_{1-x})_{0.5}In_{0.5}P/GaP$ light emitting diodes" on Appl. Phys. Lett. Vol. 64, No. 21, 2839 (1994). The TS AlGaInP LED was fabricated by growing a very thick (about 50 μm) p-type GaP window layer by hydride vapor phase epitaxy (HVPE) formed on epi-layers light emitting structure. Subsequently, the temporary n-type GaAs substrate is selectively removed using conventional chemical etching techniques. After removing the GaAs substrate, the LED epilayer structure is then bonded to an 8–10 mil thick n-type GaP substrate.

For the light illuminated concerned, the TS AlGaInP LED exhibits a two fold improvement in light output compared to absorbing substrate (AS) AlGaInP LEDs. However, the fabrication process of TS AlGaInP LED is very complicated. Since the bonding process is to make two III–V semiconductor wafers directed bond together by heating and pressing for a period of time. Even worse, a non-ohmic contact interface between them is generally found to have high resistance. To manufacture these TS AlGaInP LEDs in high yield and low cost is difficult as a result.

Another conventional technique was proposed by Horng et al., on Appl. Phys. Lett. Vol. 75, No. 20, 3054 (1999) entitled "AlGaInP light-emitting diodes with mirror substrates fabricated by wafer bonding." Horng et al., reported a mirror-substrate (MS) of $AlGaInP/metal/SiO_2/Si$ LED fabricated by wafer-fused technology. In LED, AuBe/Au stack layer function as a bonding layer for silicon substrate and epi-layer LED. However, the intensity of the AlGaInP LED is only about 90 mcd under 20 mA injecting current. The light intensity is at least lower than that of TS AlGaInP LED by 40%. It could not be satisfied.

SUMMARY OF THE INVENTION

An object of the present invention is thus to provide a LED structure which is composed a newly bonding layer and a transparent substrate.

Firstly, a temporary semiconductor substrate having epi-layers thereon sequentially formed, from a bottom thereof, with an n-type etch stop layer, an n-type cladding layer, an active layer epi-layers, a p-type cladding layer, and a p-type ohmic contact epi-layer is prepared. And then a first metal electrode is formed on the p-type ohmic contact epi-layer.

Thereafter the temporary semiconductor substrate is bonded to a transparent substrate with the p-type ohmic contact epi-layer and the first metal electrode face to the transparent substrate by a BCB, a transparent resin or the like. Next the temporary semiconductor substrate is removed by etching and stopping at the etch stop layer.

After that, two steps of lithographic and etching methods are carried out successively so as to form an opening that exposes the first metal electrode. In the first lithographic and etching step, a trench of about 3 to 6 mils in width is formed, which exposes a portion of the p-type ohmic contact epi-layer. In the second lithographic and etching step, a contact channel of about 0.5 to 3 mils in width is formed to contact the first metal electrode. Thereafter, the processes are performed to form a transparent conductive layer atop the etch stop layer, to form a first boding metal on the contact channel, and a second boding metal (or called second electrode) on the transparent conductive layer.

The second preferred embodiment is modified from the first preferred embodiment. The approaching of forming a trench and a contact channel are as the first preferred embodiment The modified portion is the second boding metal, which is refilled in a preserved hole constructed by photoresist and transparent conductive layer, Thus after the photoresist removal, the second bonding layer is higher than a surface level of the transparent conductive layer.

In the third preferred embodiment, the two step etchings to form a trench and a contact channel are the same as prior two preferred embodiments. Thereafter a contact hole or a recess region is formed in the etch stop layer first, and then a transparent conductive layer is formed on the etch stop layer including refilled the contact hole or the recess region.

In the fourth preferred embodiment, the two step etchings to form a trench and a contact channel are the same as before, A dielectric region is then formed in the etch stop layer. Thereafter the processes of forming the transparent conductive layer and two bonding metals are as the first prior embodiment.

In the fifth preferred embodiment, the processes are modified from the fourth preferred embodiment. Instead of forming a dielectric region, a high resistance region is formed in the etch stop layer by ion implant with nonconductive ions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention disclosed a new LED structure and the making method. The detailed descriptions accompany with the FIG. 1 to FIG. 7 are as follows.

Figure 1:
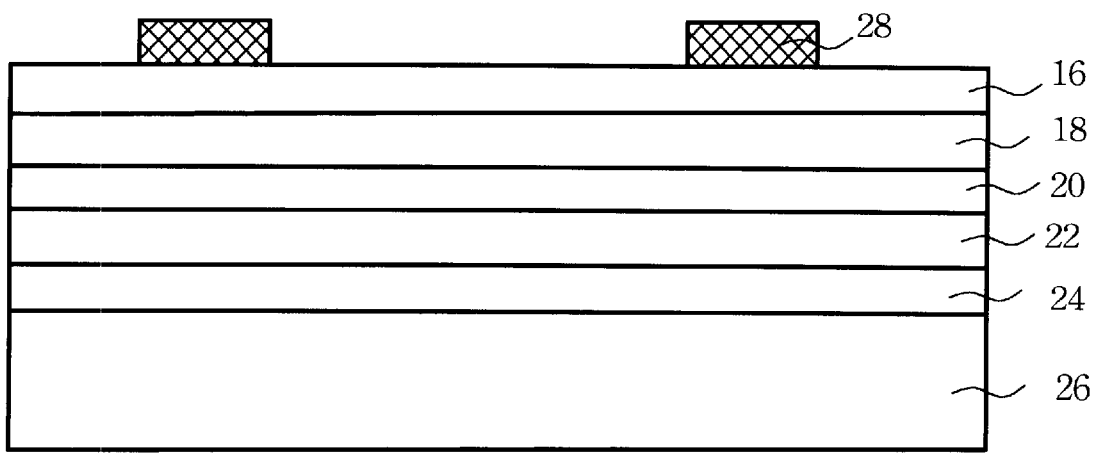
FIG. 1 is a schematic cross-sectional view of the light emitting diode before bonding with a transparent substrate according to the present invention.

Referring to FIG. 1, the cross-sectional view shows an epi-LED stack structure comprises, from a bottom thereof, an n-type temporary GaAs substrate 26, an etching stop layer 24, a lower cladding layer 22, an active layer 20 an upper cladding layer 18, a p-type ohmic contact epi-layer 16 and a p-type metal electrode 28. The shape of the metal electrode 28 is arbitrary, shown in the figure is a ring shape, so two electrode blocks 28 are observed in a cross-sectional view.

The lower cladding layer 22 is an n-type $(Al_xGa_{1-x})_{0.5}In_{0.5}P$. The active layer 20 is an undoped $(Al_xGa_{1-x})_{0.5}In_{0.5}P$ layer and the upper cladding layer 18 is a p-type $(Al_xGa_{1-x})_{0.5}In_{0.5}P$ layer.

The p-type ohmic contact epi-layer 16 can be a layer selected from GaP, GaAsP, AlGaAs or GaInP. All of the candidates for serving as the p-type ohmic contact epi-layer 16 require having an, energy band gap higher than those of the active layer thereby alleviating the light absorption. Moreover, the p-type ohmic contact epi-layer 16 usually has high carrier concentrations doped therein so as to form a good ohmic contact. The $(Al_xGa_{1-x})_{0.5}In_{0.5}P$ active layer 20 is with Al composition of about x=0 to 0.45. The Al dosage in the upper cladding layer 18 and lower cladding layer 22 is of about x=0.5 to 1.0. For situation of without Al containing, the wavelength of the light emitted from $Ga_{0.5}In_{0.5}P$ LED is about 635 nm, which is in range of red visible light.

As is known by skilled in the art, the ratio of forgoing compound is, for example of the preferred embodiment only, not intended to limit the claim scope. The invention is also applied to any ratio of the composition. Furthermore, the structure of active layer 20 can be a single hetero-structure (SH), a double hetero-structure (DH), or multiple quantum wells (MQW). For DH, it comprised: the n-type $(Al_xGa_{1-x})_{0.5}In_{0.5}P$ lower cladding layer 22, the $(Al_xGa_{1-x})_{0.5}In_{0.5}P$ active layer 20 and the p-type $(Al_xGa_{1-x})_{0.5}In_{0.5}P$ upper cladding layer 18. The typical thickness of the layer 22, 20, and 18 are respectively, between about 0.5 –10 μm, 0.5–2.0 μm and 0.5–3.0 μm in thickness, The thicker of lower cladding layer 22 is with, the more evenly spread the current will be. Since, the lower cladding layer 22 does not absorb the light emitting from the active layer. Thus it does not affect the light emitting efficiency.

The preferred material of the etching stop layer 24 according to the present invention can be any III–V compound semiconductor material that has an etching selectively to that of the GaAs substrate 26. As to the lattice matched with that of the GaAs substrate 26 is not crucial. It's for sure, if the lattice matched well is also preferred because it can reduce the dislocation density. The good candidates of those satisfied above conditions, for examples, InGaP or AlGaAs can be served as the etch stop layer 24. The lower cladding layer 22 can also be served as the etching stop layer 24 since it has a high selectivity to GaAs substrate 26, and thus if the thickness of the lower cladding layer 22 is thick enough, the etch stop layer 24 becomes optional.

Figure 2:
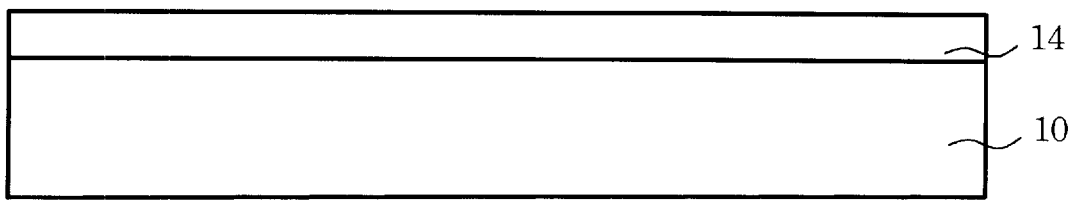
FIG. 2 is a schematic cross-sectional view of the transparent substrate coated with transparent adhesive layer according to the present invention.

Subsequently, a structure as shown in FIG. 2 is prepared. The structure comprises a transparent adhesive layer 14, for example, a BCB (B-staged bisbenzocyclobutene; BCB) layer and a transparent substrate (TS) 10. The material of the adhesive layer 14 is not limited to BCB. Any adhesive material with similar property, such as epoxy is also applicable to the invention. The transparent substrate 10 can be a substrate selected from glass, sapphire, SiC, GaP, GaAsP, ZnSe, ZnS, or ZnSSe. Other materials can also be chosen as the transparent substrate 10 as long as the light absorbed by the material is minor. One advantage of the present invention is that the transparent substrate 10 is not limited to be a single crystal substrate. The transparent substrate herein is used for supporting the LED epitaxial layer and avoids the LED epi-layers from breaking. In addition, the injected current does not need to flow through the transparent substrate 10. In other words, either poly-crystal or amorphous crystal can be used as the TS 10. Accordingly, the manufacture can be cost down.

Thereafter, the epi-layer structure as shown in FIG. 1 is bonded together with the TS 10 by BCB layer 14. The adhesion process is carried out at a temperature of about 250° C. with pressure and heat for a while. To improve the adhesion well, prior to coat a BCB layer 14 on the surface of the TS 10, a step of coating an adhesion prompter on the surface of TS 10 can be optionally done. Alternatively, after epi-layers bonded with transparent surface by BCB, the thermal process can be firstly performed at 60 to 100° C. For a while to evaporate organic solvent away, and then heated and pressed at a temperature of about 200–600° C.

Thereafter, the opaque n-type GaAs substrate 26 is then removed and stopped at the etching stop layer 24 by an etchant mixture, for example, $5H_3PO_4:3H_2O_2:3H_2O$ or $1NH_4OH:35H_2O_2$.

Figure 3A:
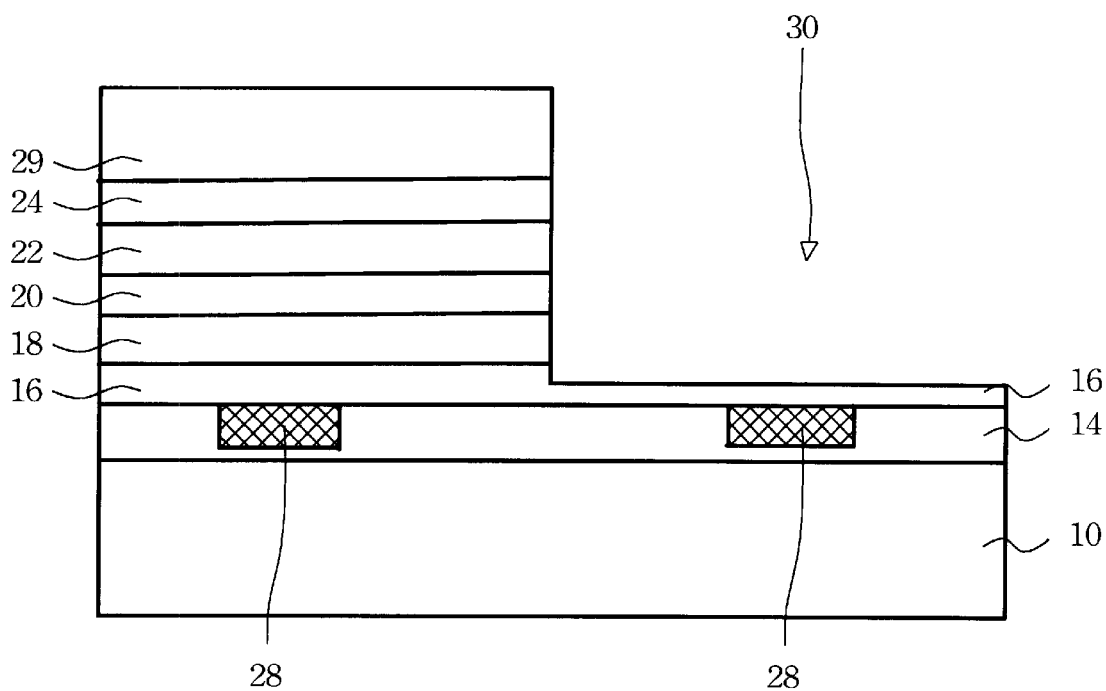
FIG. 3A to FIG. 3E are schematic cross-sectional views of a series of fabricating process for a light emitting diode according to the first preferred embodiment of the present invention.
Figure 3B:
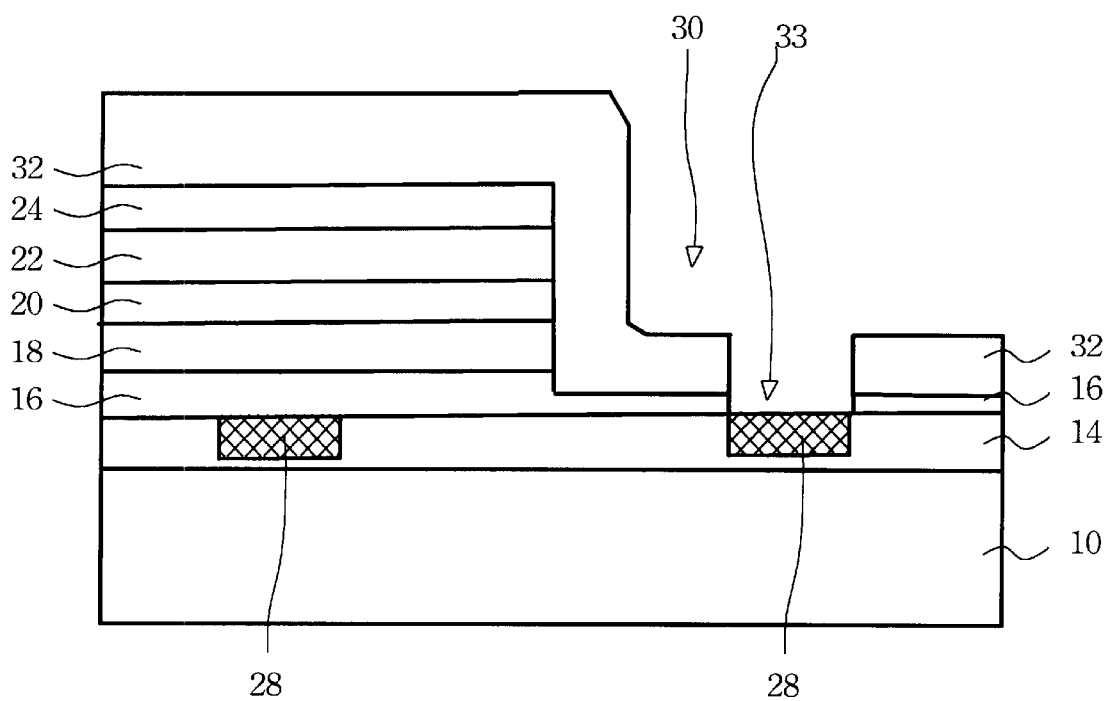

Referring to FIG. 3A, a first photoresist pattern 29 is then coated on the etch stop layer 24 to define a first trench 30. A dry etching, for example, RIE (reactive ion etching), is then applied to sequentially remove the exposed portion of the etch stop layer 24, the lower cladding layer 22, the active layer 20 and upper cladding layer 18 and slightly etch the p-type ohmic contact epitaxial layer 16 so as to further remove a portion thickness thereof, as is shown in FIG. 3B. Two step levels are formed.

After stripping the first photoresist pattern 29, as is shown in FIG. 3B, a second photoresist pattern 32 having a strip of opening of about 0.5 to 3 mil is formed on the p-type ohmic contact epitaxial layer 16 so as to define a contact channel 33 therein to connect the p-type ohmic contact metal electrode 28. Thereafter, a second dry etch is performed using the second photoresist pattern 32 as a mask to form a contact channel 33.

Figure 3C:
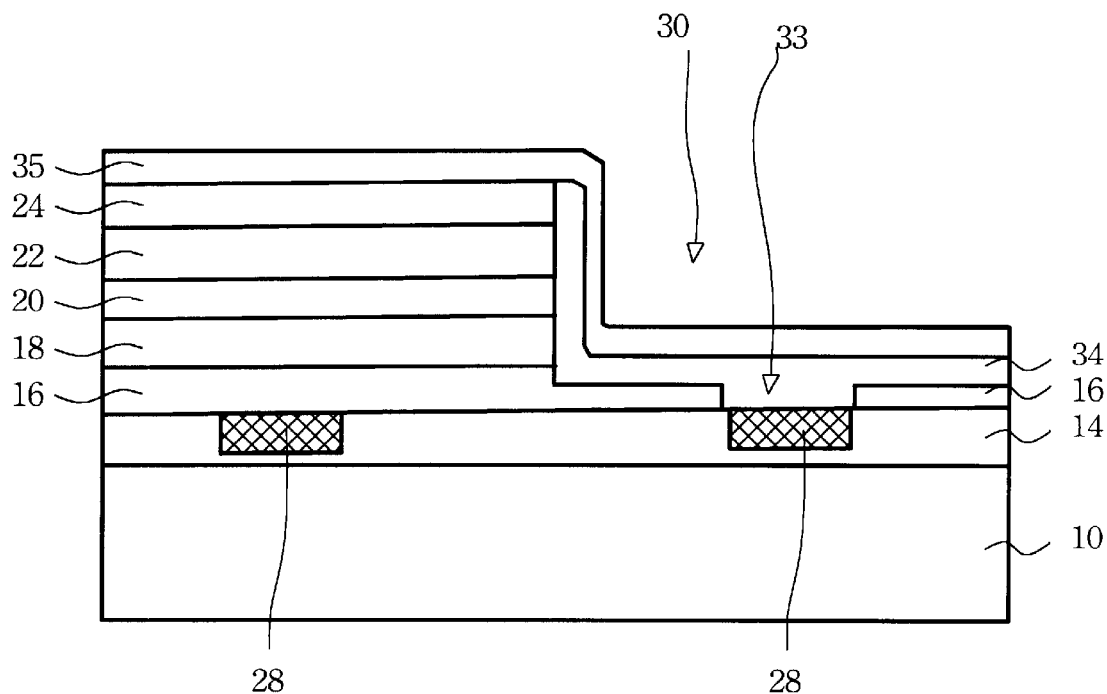
Figure 3D:
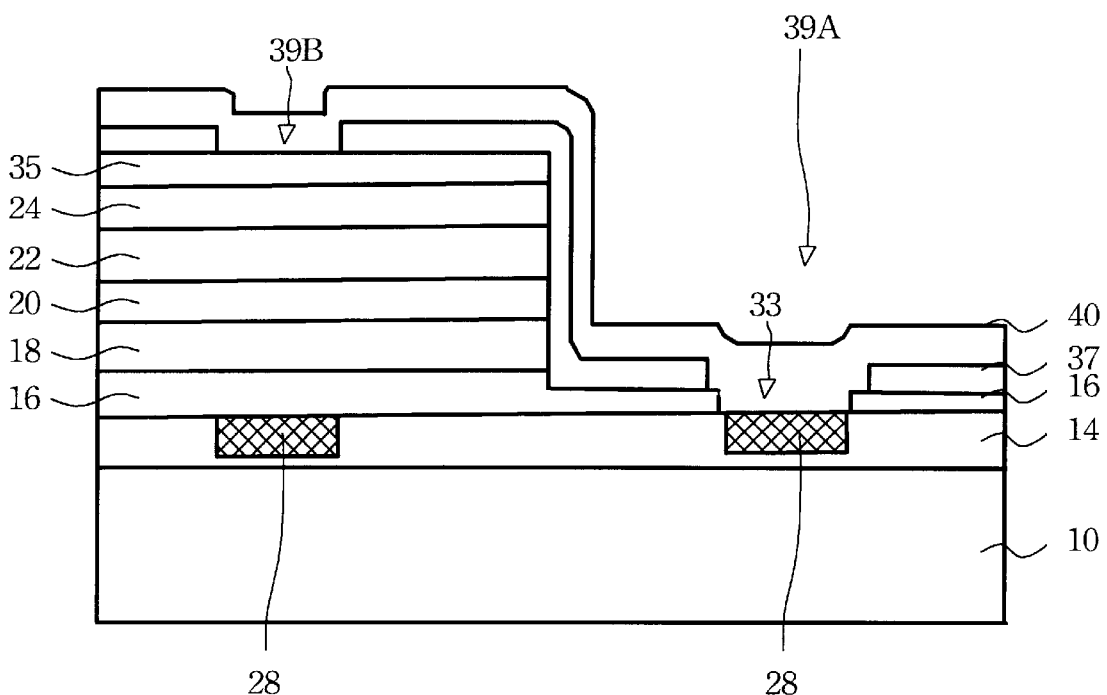
Figure 3E:
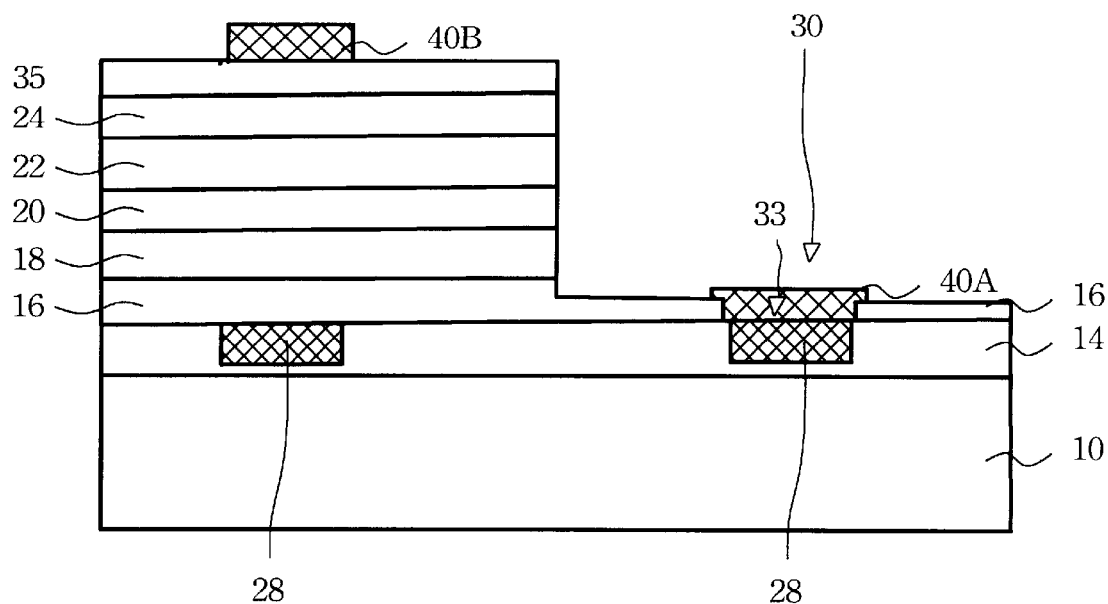

After etching is implemented, the second photoresist pattern 32 is removed, as is shown in FIG. 3C, a third photoresist pattern 34 is coated on the exposed sidewall surface and bottom surface of first trench 30. Next, a lithographic process is performed to expose the surface of the etch stop layer 24. Then, an n-type ohmic contact transparent electrode 35 is deposited on the etch stop layer 24 and on the third photoresist resist pattern 34. The n-type ohmic contact transparent conductive layer 35 is selected from materials with properties of low resistance, and high transparent oxide layer such as a layer of indium tin oxide (ITO), indium oxide, tin oxide, zinc oxide or magnesium oxide. The thickness of ohmic contact transparent electrode 35 of about 100 Å to 10000 Å is preferred. Alternatively, a thin metal layer with 30 Å to 300 Å in thickness can replace for the ohmic contact transparent conductive layer 35. The thin metal layer 35 can be chosen from Au, GeAu, Al, Ti, Ni and the combination thereof. The metal layer 35 is transparent for a layer with such thickness. Since the adhesion of the transparent oxide layer or thin metal layer 35 on the photoresist layer 34 is much weaker than those on the etch stop layer 24, a lift off technique which is tapping an adhesive tap and then pull it up is thus easier to strip the weaker adhesive portions layer away. Thereafter, referring to FIG. 3D, a lithographic is carried out to coat a fourth photoresist pattern 37 on the resulting surfaces. The fourth photoresist pattern 37 includes opening 39A and 39B. The opening 39A is slightly larger than the contact channel 33 to expose the metal electrode 28 and the opening 39B is to define the position of electrode on the transparent conductive layer 35. Thereafter, a meal layer 40 is deposited on the resulting surface by sputtering or by E-beam process as is shown in FIG. 3D. A lift off technique is then done to strip the portion of metal layer 40 on the fourth photoresist pattern 37 and then removes the residue fourth photoresist 37, as is shown in FIG. 3E. Thus, the remnant metal layer 40A is only left on the contact channel 33 and the metal layer 40B on transparent conductive layer 35.

Figure 4A:
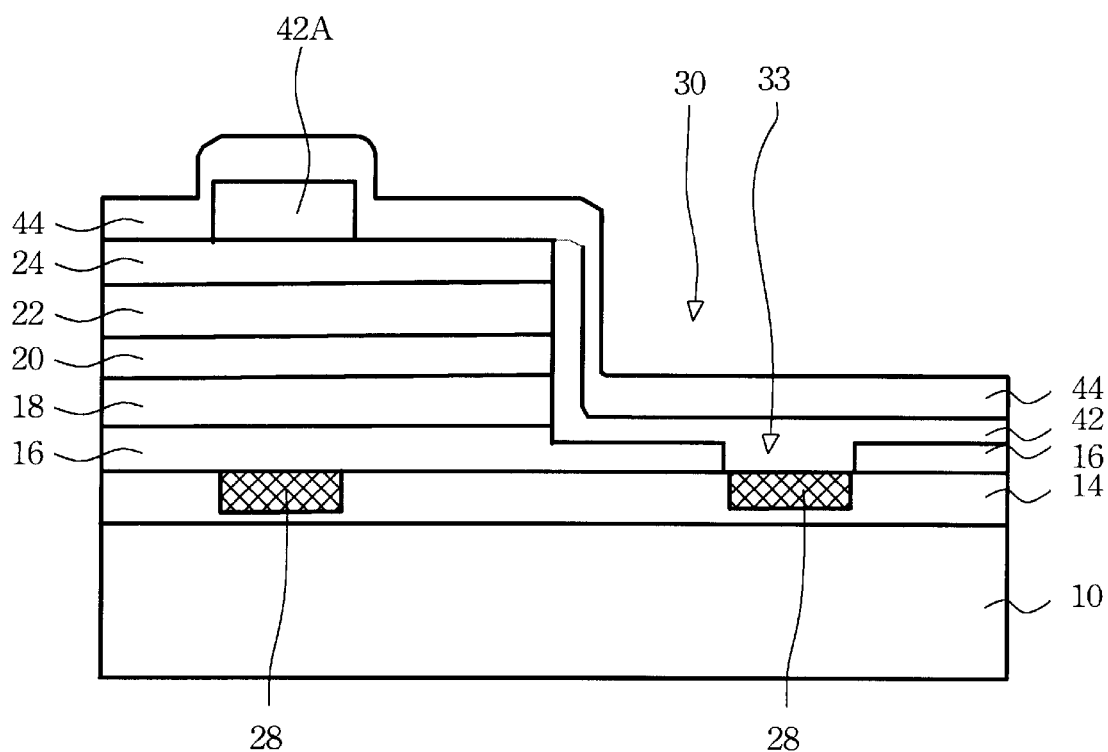
FIG. 4A to FIG. 4C are schematic cross-sectional views of a series of fabricating process for a light emitting diode according to the second preferred embodiment of the present invention.
Figure 4B:
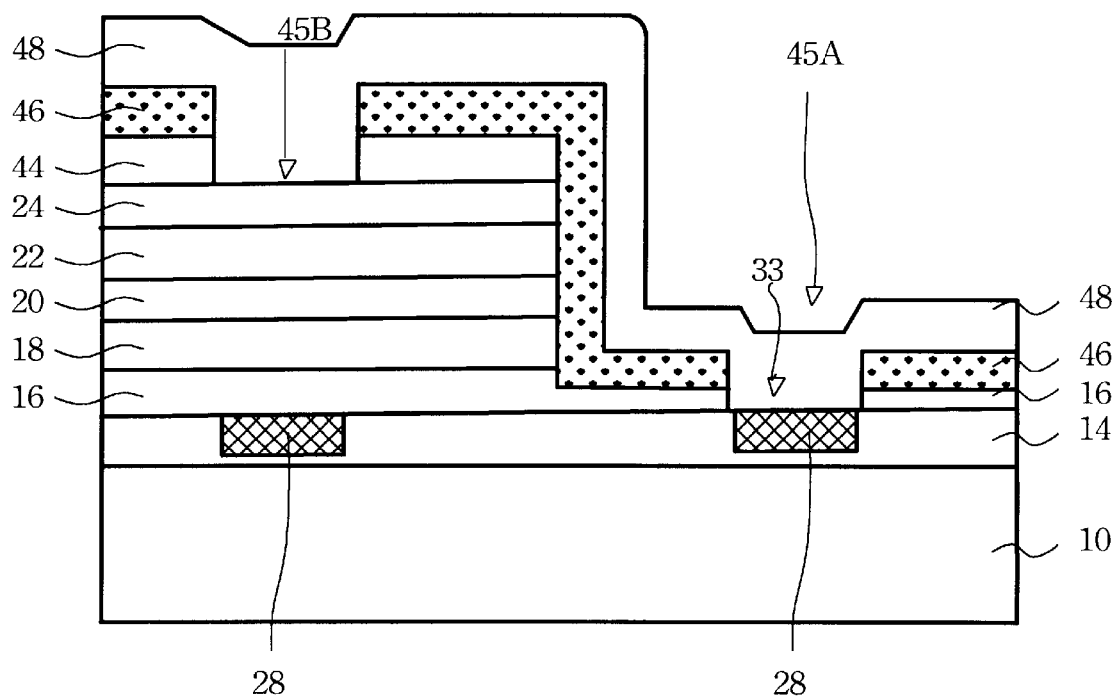
Figure 4C:
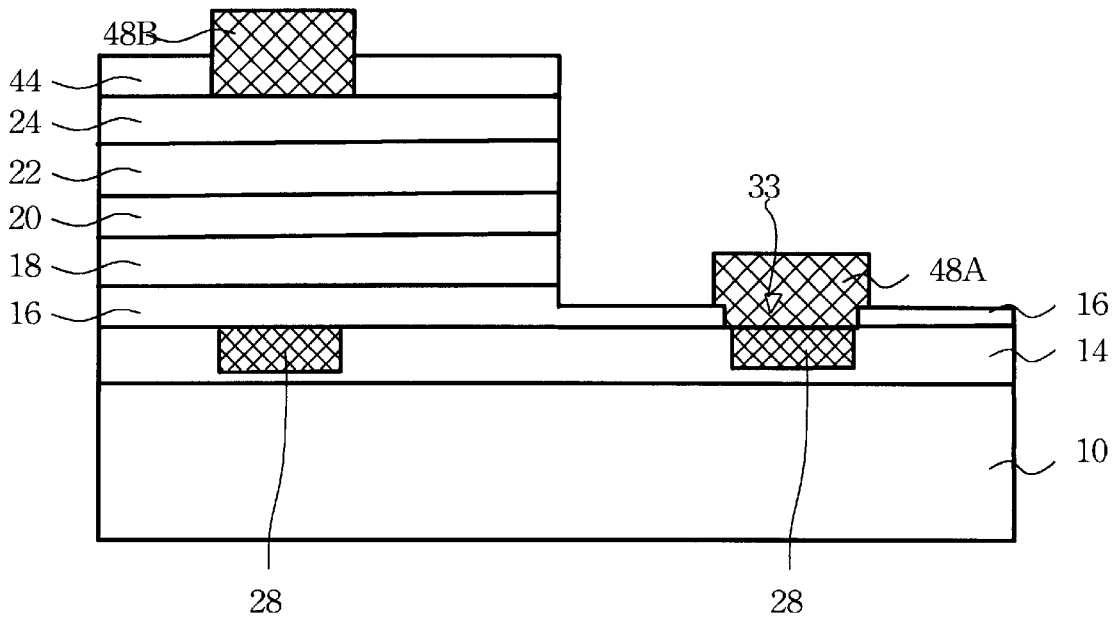

The method of second preferred embodiment according to the present invention is shown in FIG. 4A. After two etching steps are sequentially implemented for forming the first trench 30 and the contact channel 33 as the first preferred embodiment, a fifth photoresist pattern 42 is coated on a side wall, on a bottom of the first trench 30 and contains also a photoresist block 42A on an etch stop layer 24 by lithographic method. A transparent oxide layer or thin metal layer is then formed on the resulting surface, including the exposed portion of the etch stop layer 24 and on the fifth photoresist layer 42, the photoresist block 42A. Then a lift off process is performed so that a transparent conductive layer 44 contains an opening refilled is formed on the etch stop layer 24. Finally, as is shown in FIG. 4B a sixth photoresist pattern 46, including an opening 45A exposed contact channel 33, and an opening 45B exposed etch stop layer 24 on the transparent conductive layer 44, is formed by coating and lithographic method. Next a metal layer 48 formed on all surfaces, a lift off process to strip away those of weak bonding portions and remnant photoresist removal are successively carried out. The result is shown in FIG. 4C, where the metal layer 48A and 48B are not only filled in the contact channel 33 and opening, 45B, respectively but also have an altitude higher than the surface level of the transparent conductive layer 44. Note, the contact between the metal layer 48B and the transparent electrode 44 is of Shockley contact. Consequently, the metal layer 48B is served as a current block so as to distribute the current evenly.

Figure 5:
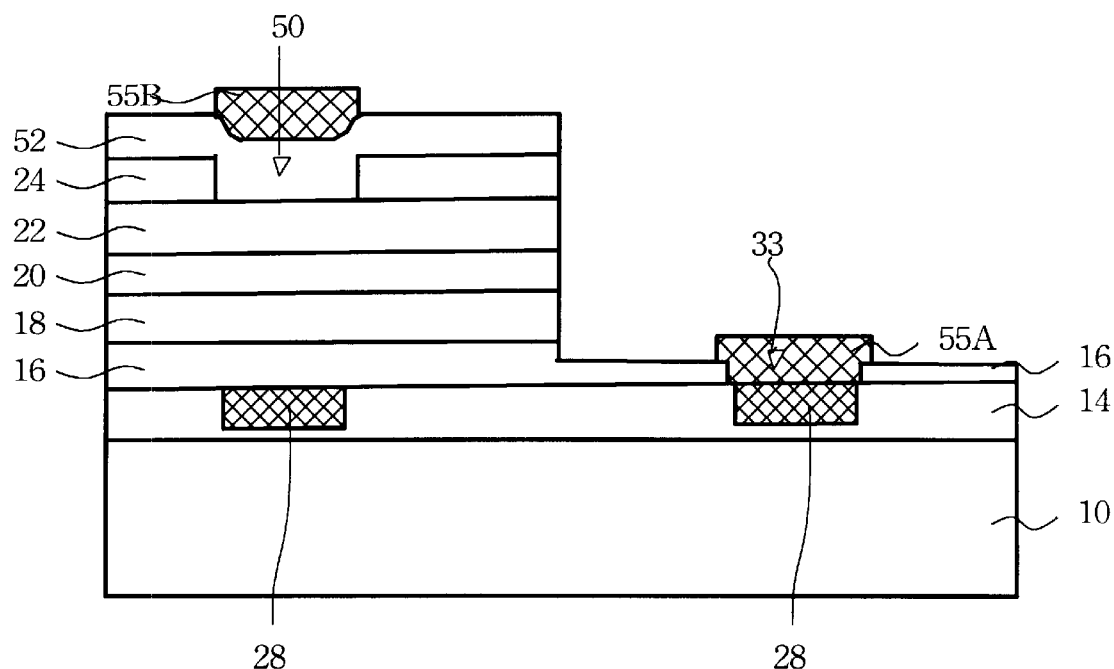
FIG. 5 is a schematic cross-sectional view of fabricating a light emitting diode according to the third preferred embodiment of the present invention.

The third preferred embodiment according to the present invention is shown in FIG. 5. Slightly different from two prior preferred embodiments, before forming the transparent electrode 55, a lithographic and an etching step are sequentially performed to form a recessive region 50 in the etch stop layer 24 and expose the lower cladding layer 22 thereto. Then transparent conductive layer 52 and metal layer 55A and 55B are formed as second preferred embodiment. The transparent electrode 52 filled in the etch stop layer is to distribute the injunction current uniformly.

Figure 6:
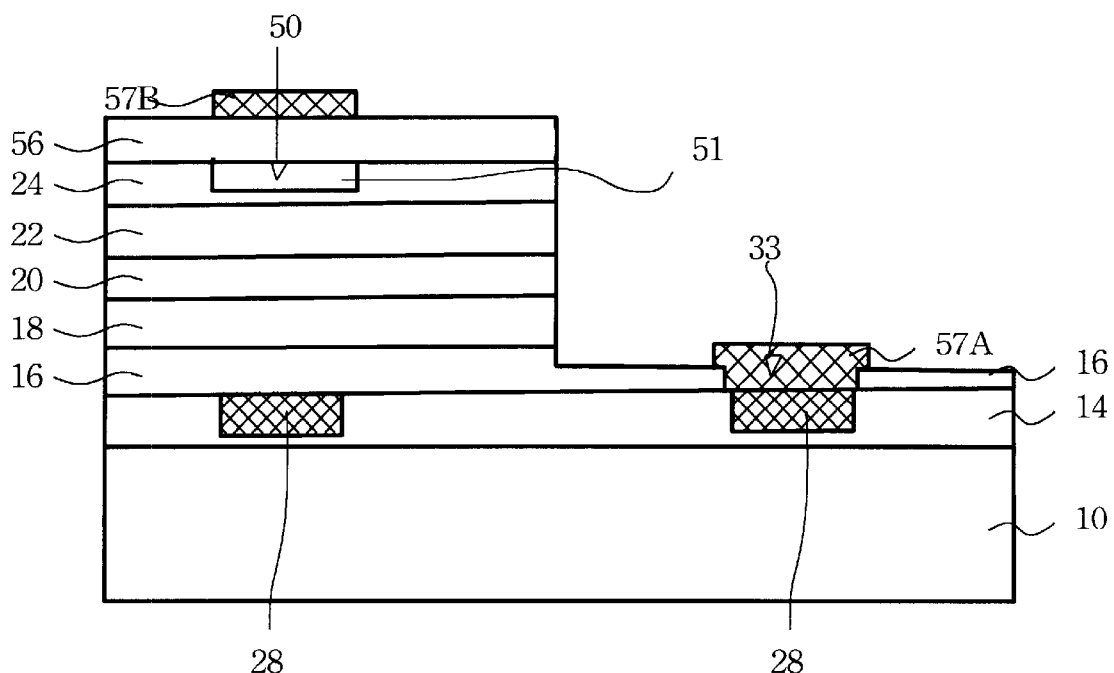
FIG. 6 is a schematic cross-sectional view of fabricating a light emitting diode according to the fourth preferred embodiment of the present invention.

The fourth preferred embodiment according to the present invention is shown in FIG. 6, which is modified from the third preferred embodiment. After forming a recess region 50 in the etch stop layer 24, a dielectric layer 51 is refilled in the recession region 50. The dielectric layer 51 is chosen from silicon dioxide silicon nitride or aluminum oxide. The dielectric layer 51 is a current block which makes the current flow distributed out of the second electrode 57B. The successively steps of forming the transparent electrode 56 and the metal bonding layer 57A and 57B are similar to those steps of forming the metal bonding layer 40A and the transparent electrode 35.

Figure 7:
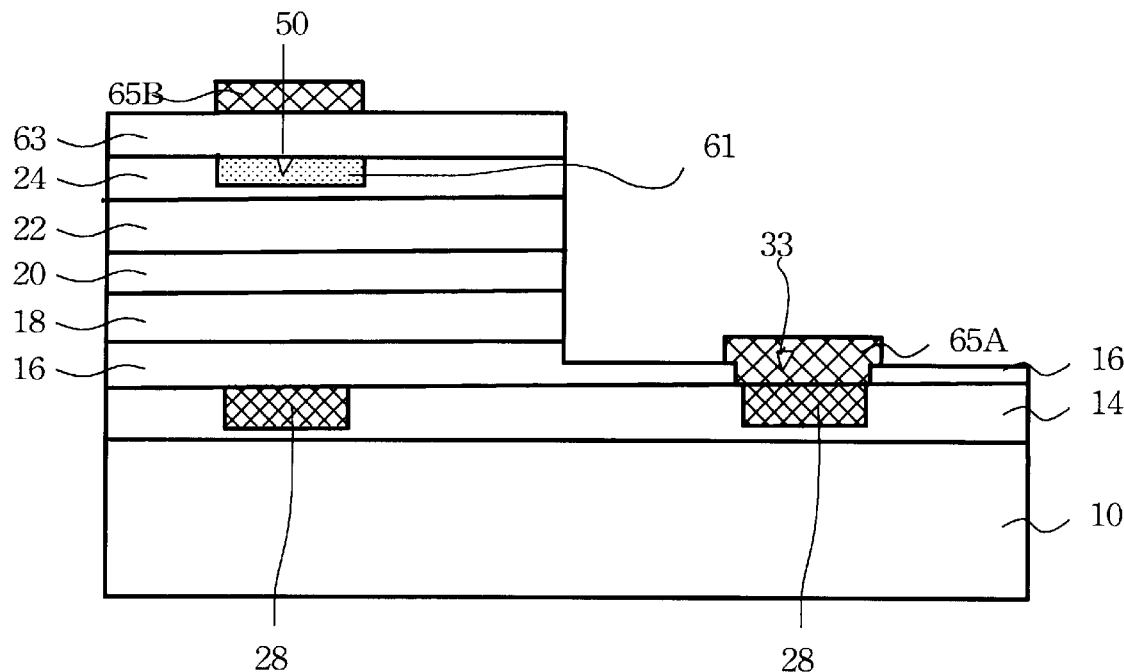
FIG. 7 is a schematic cross-sectional view of fabricating a light emitting diode according to the fifth preferred embodiment of the present invention.
Figure 8:
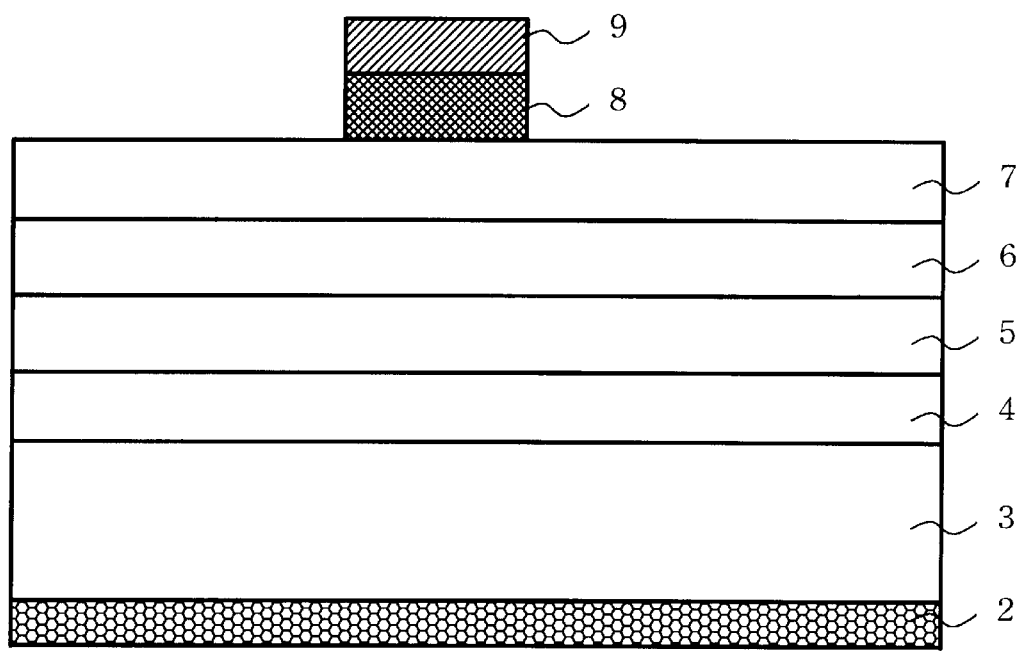
FIG. 8 is a schematic cross-sectional view of fabricating a light emitting diode according to the prior art.

The fifth preferred embodiment according to the present invention is shown in FIG. 7, which is modified from the fourth preferred embodiment. Instead of forming a recess region and then refilled in by a dielectric layer 51, the current block of a high resistance region 61 is formed by performing a lithographic process to pattern a region and then performing ion implantation with oxygen ions or hydrogen ions into the etch stop layer 24. The transparent conductive layer 63 and the metal bonding layer 65A and 65B are formed as the same steps as depicted in the first preferred embodiment. Another approaching of forming high resistance region 61 is through diffusion of oxygen and hydrogen instead of ion implant.

The power output of the AlGaInP four components LED, operated at 2 mA in accordance with the present invention is of about 4 mW which is about two times as light intensity as conventional LED including absorption substrate.

While the preferred embodiment of the invention has been illustrated and described, it will be appreciated that various changes can be made therein without departing from the spirit and scope of the invention.

What is claimed is:
1. A structure of light emitting diode, comprising:
   a transparent substrate;
   an epi-layers from a bottom thereof, being with a p-type ohmic contact layer, a light emitting cladding layer, and an n-type etch stop layer, wherein said epi-layers have a portion of said n-type etch stop layer, and said light emitting cladding layer is removed so as to expose said p-type ohmic contact layer and further said light emitting cladding layer is to generate light in response to a current injection;

a first p-type metal electrode formed thereon a bottom surface of said p-type ohmic contact epi-layer;

an opening formed on an upper surface of said p-type ohmic contact layer, which is exposed;

a second p-type metal electrode formed and refilled said opening so as to contact said first p-type metal electrode a transparent adhesive layer bonding said transparent substrate and said p-type ohmic contact epi-layer and said first p-type metal electrode together;

a transparent conductive layer formed on an upper surface of said n-type etch stop layer; and an n-type metal electrode formed on said transparent oxide layer.

2. The structure of light emitting diode according to claim 1, wherein said light emitting cladding layer comprises an n-type cladding layer, an active layer, a p-type cladding layer.

3. The structure of light emitting diode according to claim 1, wherein said transparent adhesive layer is a BCB (B-staged bisbenzocyclobutene) resin.

4. The structure of light emitting diode according to claim 1, wherein said transparent substrate is selected from the group consisting of ZnSe, ZnS, ZnSSe, SiC, GaP, GaAsP, and sapphire.

5. The structure of light emitting diode according to claim 1, wherein said transparent substrate is a single crystal or polycrystalline.

6. The structure of light emitting diode according to claim 1, wherein said transparent conductive layer is an oxide layer selected from the group consisting of indium tin oxide (ITO), indium oxide, tin oxide, zinc oxide, and magnesium oxide.

7. The structure of light emitting diode according to claim 1, wherein said transparent conductive layer is a metal layer with a thin thickness so that said transparent conductive layer is transparent for light generated from said light emitting cladding layer.

8. The structure of light emitting diode according to claim 1, wherein said first p-type metal electrode has a shape of donut-like.

9. The structure of light emitting diode according to claim 1 wherein said n-type etch stop layer have a through hole formed therein, so that said transparent conductive layer not only formed on said n-type etch stop layer but also refilled said through hole to contact said light emitting cladding layer.

10. The structure of light emitting diode according to claim 1 wherein said n-type etch stop layer beneath said n-type metal electrode has an opening formed, which is filled with a dielectric layer.

11. The structure of light emitting diode according to claim 1 wherein said n-type etch stop layer beneath said n-type metal electrode has a high resistance region formed therein.

12. The structure of light emitting diode according to claim 1 wherein said transparent conductive layer has a through hole so that a lower portion of said n-type metal electrode is embedded in said transparent conductive layer.

13. A structure of light emitting diode, comprising:

a transparent substrate;

an epi-layers, stacked sequentially from a bottom thereof, being with an n-type etch stop layer, an n-type cladding layer, an active layer, a p-type cladding layer, and a p-type ohmic contact epi-layer;

a p-type metal electrode formed on a bottom surface of said p-type ohmic contact epi-layer;

a transparent adhesive layer bonding said p-type metal electrode and remnant exposed portion of said p-type ohmic contact layer to said transparent substrate;

wherein said stack structure has two step levels, and the lower one of two step level exposes a portion of upper surface of said p-type ohmic contact layer, and has a contact channel formed so as to expose a portion of said p-type metal electrode, and the upper step level is exposed said n-type etch stop layer;

a transparent conductive layer formed on said etch stop layer;

a first bonding metal electrode formed on said transparent conductive layer; and a second bonding metal electrode formed to fill said contact channel and protruded said upper surface of said p-type ohmic contact layer.

14. The structure of light emitting diode according to claim 13, wherein said transparent adhesive layer is a BCB (B-staged bisbenzocyclobutene) resin.

15. The structure of light emitting diode according to claim 13, wherein said transparent substrate is selected from the group consisting of ZnSe, ZnS, ZnSSe, SiC, GaP, GaAsP, and sapphire.

16. The structure of light emitting diode according to claim 13, wherein said transparent substrate is a single crystal or polycrystalline.

17. The structure of light emitting diode according to claim 13 wherein said transparent conductive layer is an oxide layer selected from the group consisting of indium tin oxide (ITO), indium oxide, tin oxide, zinc oxide, and magnesium oxide.

18. The structure of light emitting diode according to claim 13, wherein said transparent conductive layer is a thin metal layer, which is selected from the group consisting of Au, GeAu, Ti, Al, and Ni.

19. The structure of light emitting diode according to claim 13, wherein said transparent conductive layer, and said etch stop layer have a contact hole, and hence said first bonding metal layer is formed to contact said lower cladding layer and has an altitude higher than a surface level of said transparent conductive layer.

20. The structure of light emitting diode according to claim 13, wherein said transparent conductive layer, and said etch stop layer have a contact hole, and hence said first bonding metal layer is formed to contact said lower cladding layer and has an altitude higher than a surface level of said transparent conductive layer.

21. The structure of light emitting diode according to claim 13, wherein said etch stop layer have a contact hole, and hence said transparent conductive layer is formed to contact said lower cladding layer.

22. The structure of light emitting diode according to claim 13, further comprising a dielectric region, where said dielectric region is at a position right under said first bonding metal electrode and formed in said etch stop layer.

* * * * *